US012633472B2

(12) United States Patent
Shu

(10) Patent No.: US 12,633,472 B2
(45) Date of Patent: May 19, 2026

(54) PIEZOELECTRIC BUTTON ASSEMBLY AND ELECTRONIC DEVICE

(71) Applicant: AAC Acoustic Technologies (Shanghai) Co., Ltd., Shanghai (CN)

(72) Inventor: Chengxiang Shu, Shanghai (CN)

(73) Assignee: AAC Acoustic Technologies (Shanghai) Co., Ltd., Shanghai (CN)

( * ) Notice: Subject to any disclaimer, the term of this patent is extended or adjusted under 35 U.S.C. 154(b) by 288 days.

(21) Appl. No.: 18/617,628

(22) Filed: Mar. 26, 2024

(65) Prior Publication Data

US 2025/0166942 A1    May 22, 2025

Related U.S. Application Data

(63) Continuation of application No. PCT/CN2023/133343, filed on Nov. 22, 2023.

(51) Int. Cl.
| | |
|---|---|
| *H01H 13/14* | (2006.01) |
| *H01H 13/04* | (2006.01) |
| *H01H 13/10* | (2006.01) |
| *H10N 30/30* | (2023.01) |
| *H10N 30/80* | (2023.01) |

(52) U.S. Cl.
CPC ............ *H01H 13/14* (2013.01); *H01H 13/04* (2013.01); *H01H 13/10* (2013.01); *H10N 30/30* (2023.02); *H10N 30/80* (2023.02)

(58) Field of Classification Search
CPC ........ H01N 30/00; H01N 30/02; H01N 30/03; H01N 30/067; H01N 30/07; H01N 30/071; H01N 30/20; H01N 30/2041; H01N 30/2047; H01N 30/30; H01N 30/302; H01N 30/304; H01N 30/306; H01N 30/50; H01N 30/501; H01N 30/80; H01N 30/853; H01N 30/8536; H01N 30/8542; H01N 30/8548; H01N 30/8554; H01N 30/8561; H01N 30/87; H01N 30/871; H01H 57/00; H01H 71/10; H01H 71/127; H01H 2057/00; H01H 2057/006; H01H 2201/02; H01H 2215/052; H01H 13/14; H01H 13/04; H01H 13/10; H01H 9/16; H01H 36/00
USPC ....................................................... 200/341
See application file for complete search history.

(56) References Cited

U.S. PATENT DOCUMENTS

2008/0092354 A1*    4/2008    Clingman .............. H10N 30/03
29/25.35

FOREIGN PATENT DOCUMENTS

FR            2940855 A1 *    7/2010    ........... H10N 30/308

* cited by examiner

*Primary Examiner* — Anthony R Jimenez
(74) *Attorney, Agent, or Firm* — Wiersch Law Group

(57)            ABSTRACT

A piezoelectric button assembly includes a support frame having a receiving space therein, a piezoelectric module received and secured into the receiving space, a flexible printed circuit passing through the support frame and extending into the receiving space, a button covered on the support frame and totally covering the receiving space, an adapter seat secured between the button and the piezoelectric module, and an elastic member secured between the button and the support frame; wherein the piezoelectric module comprises a flat piezoelectric ceramic plate and a first piezoelectric element and a second piezoelectric element that are both in an arc shape or a bowl shape. In the piezoelectric button assembly according to the present disclosure, a technical solution of a feasible piezoelectric button assembly is developed.

18 Claims, 5 Drawing Sheets

A—A

B-B

PIEZOELECTRIC BUTTON ASSEMBLY AND ELECTRONIC DEVICE

CROSS REFERENCE TO RELATED APPLICATIONS

The present application is a continuation of PCT Patent Application No. PCT/CN2023/133343, entitled "PIEZO-ELECTRIC BUTTON ASSEMBLY AND ELECTRONIC DEVICE," filed on Nov. 22, 2023, which is incorporated by reference herein in its entirety

TECHNICAL FIELD

The present disclosure relates to the technical field of buttons, and in particular, relates to a piezoelectric button assembly and an electronic device.

BACKGROUND

The piezoelectric effect refers to an effect that when a medium is subjected to a mechanical pressure, deformations, such as compression or elongation are generated, which cause the surface of the medium to become charged.

A piezoelectric button or key refers to a button or key structure which implements button or key control by means of the piezoelectric effect, which is more sensitive than a mechanical button structure and more suitable for high-performance electronic devices.

In the related art, the main structures of the piezoelectric button are proposed to include a piezoelectric module, an adapter seat, a printed circuit, and a button, however, there is no feasible technical solution in practice. That is, t the theory of the piezoelectric button is proposed in the related art, and no feasible technical solution has been developed.

Therefore, it is necessary to provide a specific technical solution of the piezoelectric button assembly.

SUMMARY

The present disclosure is intended to provide a piezoelectric button assembly and an electronic device to solve the problem in the related art that there is no feasible technical solution of a piezoelectric button.

In a first aspect, some embodiments of the present disclosure provide a piezoelectric button assembly. The piezoelectric button assembly includes a support frame having a receiving space therein. A piezoelectric module received and secured into the receiving space. A flexible printed circuit passing through the support frame and extending into the receiving space. A button covered on the support frame and totally covering the receiving space. An adapter seat secured between the button and the piezoelectric module. At least one elastic member secured between the button and the support frame. The piezoelectric module includes: a piezo-electric ceramic plate having a shape of a plate. A first piezoelectric element having an arc shape or a bowl shape. A second piezoelectric element having an arc shape or a bowl shape. The first piezoelectric element and the second piezoelectric element are positioned on two opposite sides of the piezoelectric ceramic plate, respectively. Two ends of the first piezoelectric element are secured to two ends of the piezoelectric ceramic plate, respectively. A middle region of the first piezoelectric plate is secured to a side of the support frame, and the side of the support frame is close to the button. Two ends of the second piezoelectric element are secured to the two ends of the piezoelectric ceramic plate, respectively. A middle region of the second piezoelectric element is secured to a side of the adapter seat and is electrically connected to the adapter seat, and the side of the adapter seat is away from the button. And the flexible printed circuit is abutted against the piezoelectric ceramic plate and is electrically connected to the piezoelectric ceramic plate.

As an improvement, the support frame includes: a bottom plate. A first protrusion and a second protrusion protruding from a side of the bottom plate and spaced apart from each other. The bottom plate, the first protrusion, and the second protrusion enclose to form the receiving space. Two elastic members are provided, one of the two elastic members is sandwiched and secured between the button and the first protrusion, and the other of the two elastic members is sandwiched and secured between the button and the second protrusion. As an improvement, the support frame further includes a first limit post formed by protruding from a side of the bottom plate, and the side of the bottom plate is close to the button. A first limit hole passing through the first piezoelectric element is provided at a position of the first piezoelectric element, and the position of the first piezoelectric element is corresponding to the first limit post. The first limit post is inserted into the first limit hole.

As an improvement, each of the two elastic members is made of foam.

As an improvement, the flexible printed circuit passes through the bottom plate is secured to the piezoelectric ceramic plate.

As an improvement, a second limit post is formed by protruding from a side of the adapter seat, and the side of the adapter seat is away from the button. A second limit hole passing through the second piezoelectric element is provided at a position of the second piezoelectric element, and the position of the second piezoelectric element is corresponding to the second limit post. The second limit post is inserted into the second limit hole.

As an improvement, the piezoelectric button assembly further includes a waterproof foam sheathed around a peripheral side of the button. The waterproof foam is abutted against the first protrusion and the second protrusion.

As an improvement, the peripheral side of the button is recessed to form an accommodation recess, and the waterproof foam is secured into the accommodation recess.

As an improvement, a side of the button is recessed to form a mount recess, and the side of the button is close to the piezoelectric module. The adapter seat is received and received into the mount recess.

In a second aspect, some embodiments of the present disclosure provide an electronic device. The electronic device includes an enclosure and the piezoelectric button assembly as described above that is received in the enclosure. A mount hole is provided in a side surface of the enclosure, and the support frame is secured onto the enclosure such that the button passes through the mount hole and is exposed outside the enclosure.

As an improvement, the support frame includes: a bottom plate. A first protrusion and a second protrusion protruding from a side of the bottom plate and spaced apart from each other. The bottom plate, the first protrusion, and the second protrusion enclose to form the receiving space. Two elastic members are provided, one of the two elastic members is sandwiched and secured between the button and the first protrusion, and the other of the two elastic members is sandwiched and secured between the button and the second protrusion.

As an improvement, the support frame further includes a first limit post formed by protruding from a side of the bottom plate, and the side of the bottom plate is close to the button. A first limit hole passing through the first piezoelectric element is provided at a position of the first piezoelectric element, and the position of the first piezoelectric element is corresponding to the first limit post. The first limit post is inserted into the first limit hole. As an improvement, each of the two elastic members is made of foam.

As an improvement, the flexible printed circuit passes through the bottom plate is secured to the piezoelectric ceramic plate.

As an improvement, a second limit post is formed by protruding from a side of the adapter seat, and the side of the adapter seat is away from the button. A second limit hole passing through the second piezoelectric element is provided at a position of the second piezoelectric element, and the position of the second piezoelectric element is corresponding to the second limit post. The second limit post is inserted into the second limit hole.

As an improvement, the piezoelectric button assembly further includes a waterproof foam sheathed around a peripheral side of the button. The waterproof foam is abutted against the first protrusion and the second protrusion.

As an improvement, the peripheral side of the button is recessed to form an accommodation recess, and the waterproof foam is secured into the accommodation recess.

As an improvement, a side of the button is recessed to form a mount recess, and the side of the button is close to the piezoelectric module. The adapter seat is received and received into the mount recess.

Compared to the related art, in the piezoelectric button assembly according to the present disclosure, positional and connection relationships of the support frame, the piezoelectric module, the flexible printed circuit, the button, the adapter seat, and the elastic member are defined, such that a technical solution of a feasible piezoelectric button assembly is developed.

BRIEF DESCRIPTION OF THE DRAWINGS

For clearer descriptions of the technical solutions according to the embodiments of the present disclosure, drawings that are to be referred for description of the embodiments are briefly described hereinafter. Apparently, the drawings described hereinafter merely illustrate some embodiments of the present disclosure. A person of ordinary skill in the art may also derive other drawings based on the drawings described herein without any creative effort.

Figure 1:
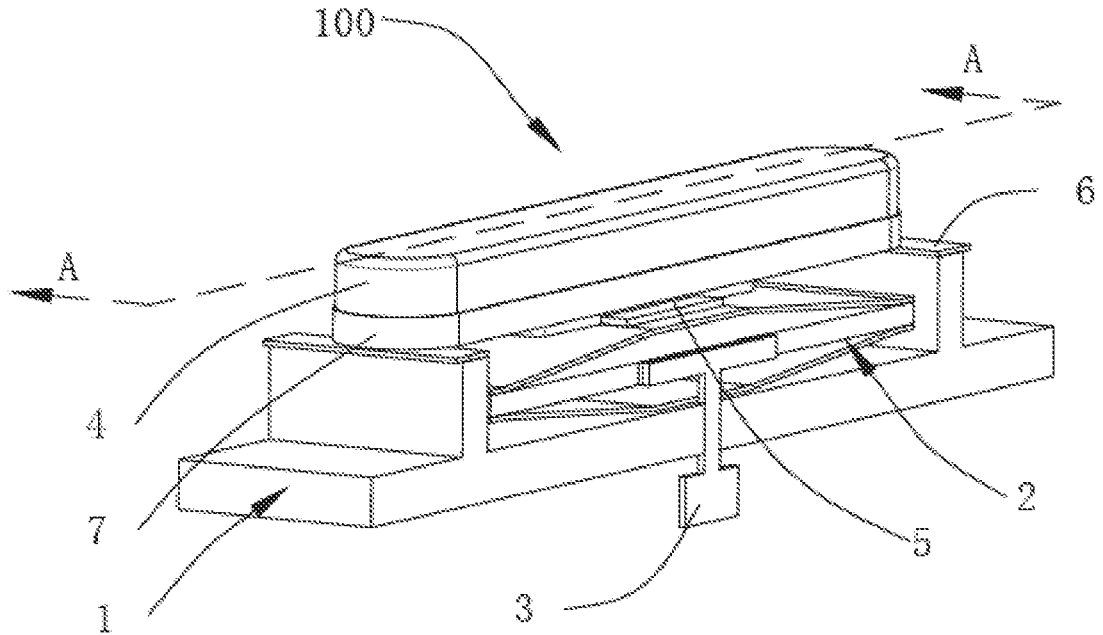
FIG. 1 is a schematic three-dimensional structural diagram of a piezoelectric button assembly according to some embodiments of the present disclosure.

Reference numerals and denotations thereof: 100—piezoelectric button assembly; 10—receiving space; 11—bottom plate; 111—first limit post; 12—first protrusion; 13—second protrusion; 2—piezoelectric module; 21—piezoelectric ceramic plate; 22—first piezoelectric element; 221—first limit hole; 23—second piezoelectric element; 231—second limit hole; 3—flexible printed circuit; 4—button; 41—accommodation recess; 5—adapter seat; 51—second limit post; 6—elastic member; 7—waterproof foam; 200—electronic device; 201—enclosure; 202—mount hole.

DETAILED DESCRIPTION

Unless defined otherwise, all technical and scientific terms used herein have the same meaning as commonly understood by one of ordinary skill in the art to which the present disclosure pertains. The terms used herein in the specification of present disclosure are only intended to illustrate the specific embodiments of the present disclosure, instead of limiting the present disclosure. The terms "comprise," "include," and any variations thereof in the specification and claims of the present disclosure and in the description of the drawings are intended to cover a non-exclusive inclusion. Terms such as "first," "second," and the like in the specifications, claims or the accompanying drawings of the present disclosure are intended to distinguish different objects, but are not intended to define a specific sequence.

The terms "example" and "embodiment" in this specification signify that the specific characteristic, structures, or features described with reference to the embodiments may be covered in at least one embodiment of the present disclosure. This term, when appearing in various positions of the description, neither indicates the same embodiment, nor indicates an independent or optional embodiment that is exclusive of the other embodiments. A person skilled in the art would implicitly or explicitly understand that the embodiments described in this specification may be incorporated with other embodiments.

It should be noted that the expressions "upper," "lower," "left," "right," and the like mentioned in the embodiments of the present disclosure are described with reference to the placement states in the drawings, and should not be construed as limiting the embodiments of the present disclosure. Furthermore, it should also be understood that when an element is referred to as being "over" or "under" another element, it is possible that the element directly constitutes "over" or "under" the other element, or that the element constitutes "over" or "under" the other element through intervening elements.

The technical solutions in the embodiments of the present disclosure are described in detail clearly and completely hereinafter with reference to the accompanying drawings for the embodiments of the present disclosure. Apparently, the described embodiments are only a portion of embodiments of the present disclosure, but not all the embodiments of the present disclosure. Based on the embodiments of the present disclosure, all other embodiments derived by persons of ordinary skill in the art without any creative efforts shall fall within the protection scope of the present disclosure.

First Embodiment

Figure 2:
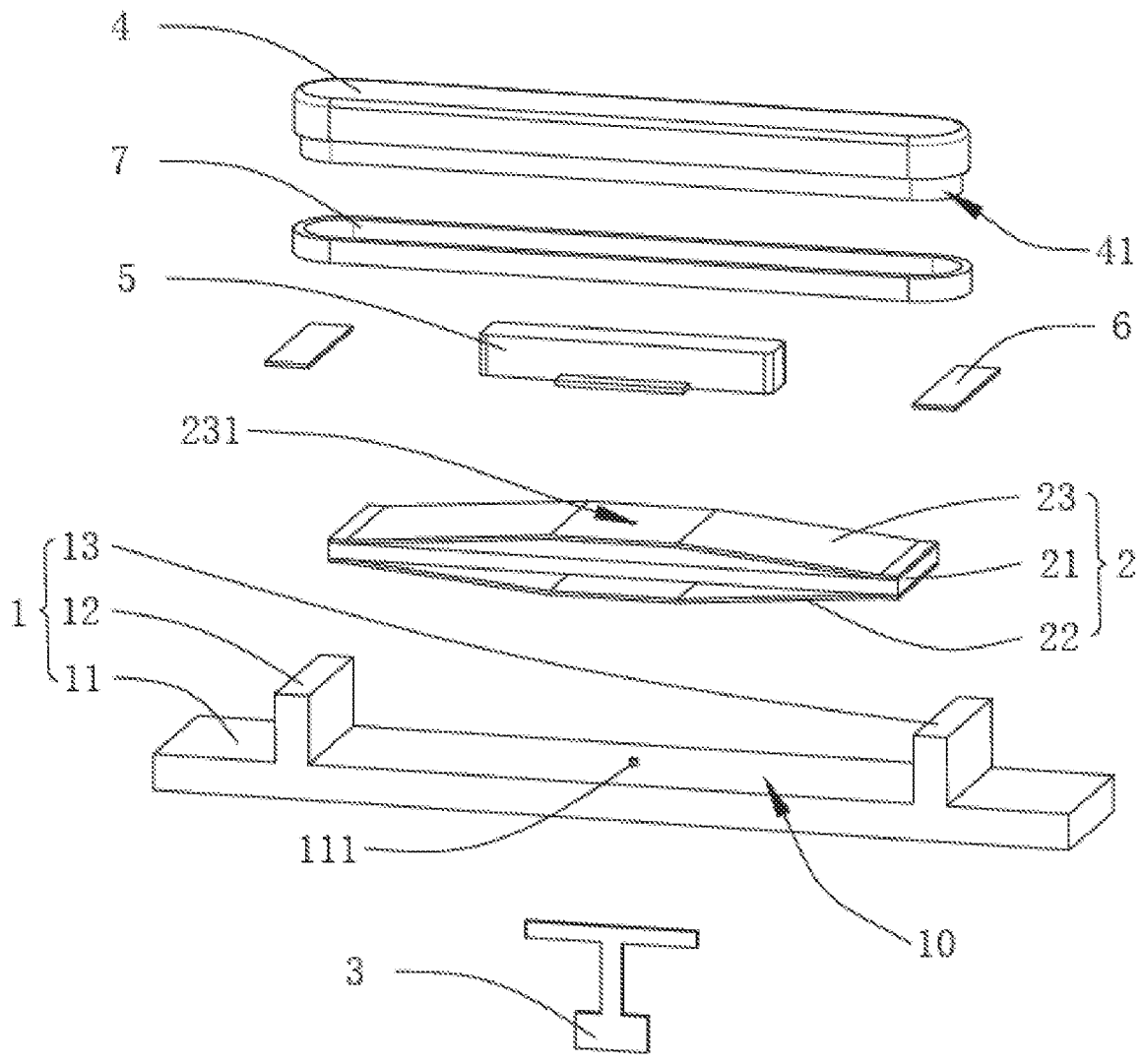
FIG. 2 is a schematic exploded structural diagram of a piezoelectric button assembly according to some embodiments of the present disclosure.
Figure 3:
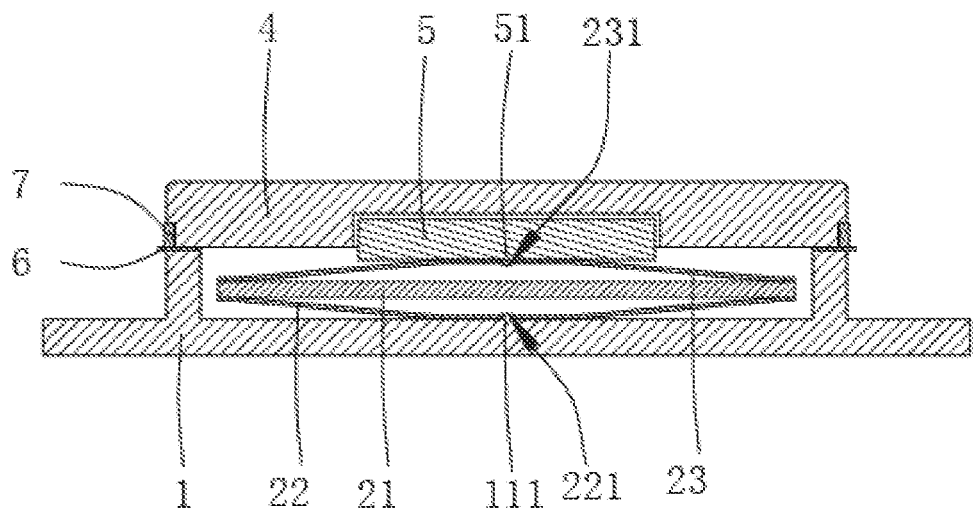
FIG. 3 is a sectional view taken along A-A line in FIG. 1.
Figure 4:
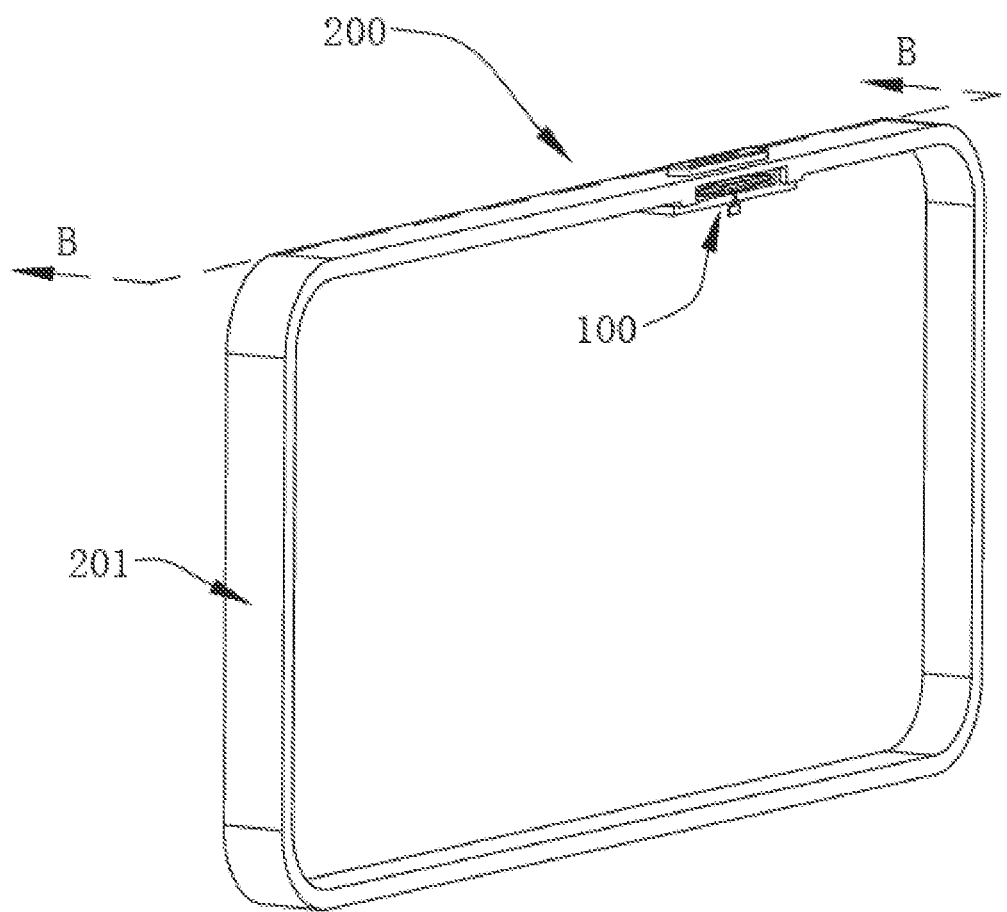
FIG. 4 is a schematic three-dimensional structural diagram of an electronic device according to some embodiments of the present disclosure.
Figure 5:
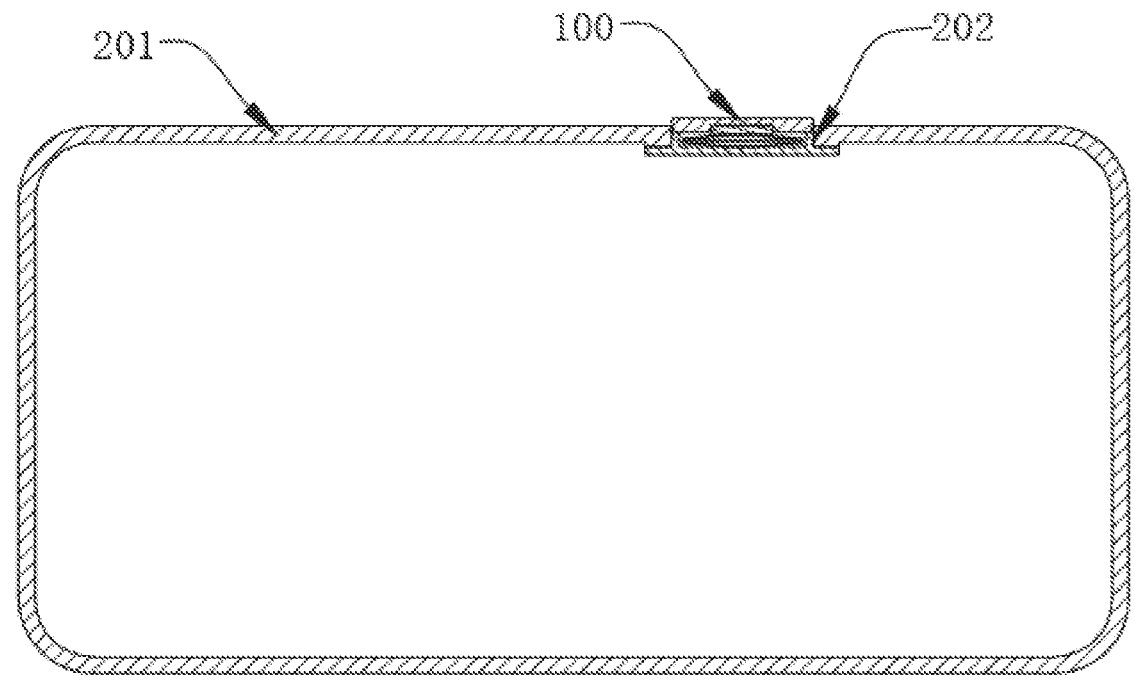
FIG. 5 is a sectional view taken along B-B line in FIG. 4.

This embodiment provides a piezoelectric button assembly 100. Referring to FIG. 1 to FIG. 3, the piezoelectric button assembly 100 includes a support frame 1 having a receiving space 10 therein, a piezoelectric module 2 received and secured into the receiving space 10, a flexible printed circuit (hereinafter FPC) 3 passing through the support frame 1 and extending into the receiving space 10, a button 4 covered on the support frame 1 and totally covering the receiving space 10, an adapter seat 5 secured between the button 4 and the piezoelectric module 2, and at least one elastic member 6 secured between the button 4 and the support frame 1.

In one example, the support frame 1 includes a bottom plate 11. The support frame 1 further includes a first protrusion 12 and a second protrusion 13 that are protruded from a side of the bottom plate 11 and spaced apart from each other. The bottom plate 11, the first protrusion 12, and the second protrusion 13 enclose to form the receiving space 10.

The first protrusion 12 and the second protrusion 13 are provided at positions away from end portions of bottom plate 11, respectively, such that corresponding holes are provided in the bottom plate 11 for securing the bottom plate 11 onto an enclosure or casing of the electronic device.

The piezoelectric module 2 includes a piezoelectric ceramic plate 21, a first piezoelectric element 22 and a second piezoelectric element 23, the piezoelectric ceramic plate 21 has a shape of a plate, the first piezoelectric element 22 has an arc shape or a bowl shape, and the second piezoelectric element 23 has an arc shape or a bowl shape. The first piezoelectric element 22 and the second piezoelectric element 23 are positioned on two opposite sides of the piezoelectric ceramic plate 21, respectively. Two ends of the first piezoelectric element 22 are secured to the two ends of the piezoelectric ceramic plate 21, respectively. A middle region of the first piezoelectric element 22 is secured to a side of the support frame 1, and the side of the support frame 1 is close to the button 4. Two ends of the second piezoelectric element 23 are secured to the two ends of the piezoelectric ceramic plate 21, respectively. A middle region of the second piezoelectric element 23 is secured to a side of the adapter seat 5, the side of the adapter seat 5 is away from the button 4, and the middle region of the second piezoelectric element 23 is electrically connected to the adapter seat 5. The flexible printed circuit 3 is secured to a side surface of the piezoelectric ceramic plate 21, and the flexible printed circuit 3 is electrically connected to the piezoelectric ceramic plate 21.

In one example, the flexible printed circuit 3 is abutted against the side surface of the piezoelectric ceramic plate 21.

The arc shapes or the bowl shapes of the first piezoelectric element 21 and the second piezoelectric element 23 have the same arc structure but with reversed mounting directions. Nevertheless, according to actual needs, the arc shapes or the bowl shapes of the first piezoelectric element 21 and the second piezoelectric element 23 may also be designed to have different arc structures, but the mounting directions need to be reversed.

In this embodiment, the first piezoelectric element 22 and the second piezoelectric element 23 both have an arc shape.

The first piezoelectric element 21 and the second piezoelectric element 23 are both secured to the piezoelectric ceramic plate 21 by glue.

The support frame 1 further includes a first limit post 111 formed by protruding from a side of the bottom plate 11, and the side of the bottom plate 11 is close to the button 4. A first limit hole 221 passing through the first piezoelectric element 22 is provided at a position of the first piezoelectric element 21, the position of the piezoelectric element 21 is corresponding to the first limit post 111. The first limit post 111 is inserted into the first limit hole 221. With this design, the first piezoelectric element 22 is better secured onto the bottom plate 11, and a limiting and securing effect is achieved.

The flexible printed circuit 3 passes through the bottom plate 11 and is secured to the piezoelectric ceramic plate 21.

In one example, the flexible printed circuit 3 passes through a middle region of the bottom plate 11 and is secured to a middle region of the piezoelectric ceramic plate 21.

A waterproof foam 7 is provided around a periphery of a side of the button 4, and the periphery of a side of the button 4 is close to the support frame 1. With this design, a waterproof effect is achieved when the piezoelectric button assembly 100 is mounted into the corresponding electronic device.

The waterproof foam 7 is disposed on the outer peripheral side of the button 4, and the waterproof foam 7 is abutted against the first protruding portion 12 and the second protruding portion 13.

In one example, the outer peripheral side of the button 4 is recessed inwardly to form an accommodation recess 41, and the waterproof foam 7 is fixed in the accommodation recess 41.

A side of the button 4 is recessed to form a mount recess, and the side of the button 4 is close to the piezoelectric module 2. The adapter seat 5 is received and secured into the mount recess. With this design, the adapter seat 5 is better secured onto the button 4, and a limiting and securing effect is achieved.

A second limit post 51 is formed by protruding from a side of the adapter seat 5, and the side of the adapter seat 5 is away from the button 4. A second limit hole 231 passing through the second piezoelectric element 23 is provided at a position of the second piezoelectric element 23, and the position of the second piezoelectric element 23 is corresponding to the second limit post 51. The second limit post 51 is inserted into the second limit hole 231. With this design, the second piezoelectric element 23 is better secured onto the adapter seat 5, and a limiting and securing effect is achieved.

The adapter seat 5 may be connected and secured with the button 5 via a snap-fit structure or an adhesive.

Two elastic members 6 are provided. One of the two elastic members 6 is sandwiched and secured between the button 4 and the first protrusion 12, and the other of the two elastic members 6 is sandwiched and secured between the button 4 the second protrusion 13.

In one example, one of the two elastic members 6 is sandwiched and secured between the button 4 and a side of the first protrusion 12, and the side of the first protrusion 12 is away from the bottom plate 11. The other of the two elastic members 6 is sandwiched and secured between the button 4 and a side of the second protrusion 13, and the side of the second protrusion 13 is away from the bottom plate 11.

In this embodiment, the elastic member 6 is made of foam. With this design, the button 4 is positioned and suspended via the foam, a press stroke of the button 4 is controlled via the foam, and a waterproof effect is achieved. Nevertheless, the elastic member 6 may be made of an elastic rubber according to actual needs, or the elastic member 6 may be a spring or an elastic piece where the waterproof effect is not considered.

In this embodiment, when a voltage is applied to the piezoelectric button assembly 100, the first piezoelectric element 22 and the second piezoelectric element 23 may increase a greater shrinkage deformation due to the arc shape or the bowl shape. On the contrary, when an external force is applied to the piezoelectric element 22 and the second piezoelectric 23, a tensile force can be applied to the piezoelectric button assembly 100, and an induced voltage is generated, such that functionality of the button is implemented.

Usage of the piezoelectric button assembly 100 according to this embodiment is as follows: The button is pressed to trigger an induced voltage, and when the induced voltage is determined as a valid press, a drive signal is supplied by the flexible printed circuit 3 to drive the piezoelectric ceramic plate 21 to a shrinkage deformation, and hence the arc shape or the bowl shape of the first piezoelectric element 22 and the second piezoelectric element 23 is caused to expand. In this way, upper and lower surfaces of the piezoelectric ceramic plate 21 output displacements, and the deformations of the first piezoelectric element 22 and the second piezoelectric element 23 are restricted by the support frame 1 to transfer the displacements to the button 4 via the adapter seat 5, such that tactile feedback is achieved.

In the piezoelectric button assembly 100 according to this embodiment, positional and connection relationships of the support frame 1, the piezoelectric module 2, the flexible printed circuit 3, the button 4, the adapter seat 5, and the elastic member 6 are defined, such that a technical solution of a feasible piezoelectric button assembly 100 is developed.

Second Embodiment

This embodiment provides an electronic device 200. Referring to FIG. 1 to FIG. 5, the electronic device includes an enclosure 201 and the piezoelectric button assembly 100 according to the first embodiment that is received in the enclosure 201. A mount hole 202 is provided in a side surface of the enclosure 201, and a support frame 1 is secured onto the enclosure 201, such that a button 4 passes through the mount hole 202 and is exposed outside the enclosure 201.

The electronic device 200 is a mobile phone, a watch, a tablet computer, or the like.

In one example, the button 4 may also pass through a back surface or other positions of the enclosure 201.

Since the electronic device 200 according to this embodiment includes the piezoelectric button assembly 100 according to the first embodiment, the electronic device 200 also achieves the technical effects of the piezoelectric button assembly 100 according to the first embodiment, which are not described herein any further.

It should be finally noted that the embodiments described with reference to the accompanying drawings are merely for illustrating rather than limiting the scope of the present disclosure. Persons of ordinary skill in the art shall understand that various modifications or equivalent replacements made to the technical solutions of the present disclosure without departing from the spirit and scope of the present disclosure shall all fall within the scope of the present disclosure. Furthermore, unless the context indicates otherwise, words appearing in the singular form include the plural and vice versa. Additionally, unless specifically stated otherwise, all or a portion of any embodiment may be used in conjunction with all or a portion of any other embodiment.

What is claimed is:

1. A piezoelectric button assembly, comprising:
a support frame having a receiving space therein;
a piezoelectric module received and secured into the receiving space;
a flexible printed circuit passing through the support frame and extending into the receiving space;
a button covered on the support frame and totally covering the receiving space;

an adapter seat secured between the button and the piezoelectric module;
at least one elastic member secured between the button and the support frame;
wherein the piezoelectric module comprises:
a piezoelectric ceramic plate having a shape of a plate;
a first piezoelectric element having an arc shape or a bowl shape;
a second piezoelectric element having an arc shape or a bowl shape;
wherein the first piezoelectric element and the second piezoelectric element are positioned on two opposite sides of the piezoelectric ceramic plate, respectively;
two ends of the first piezoelectric element are secured to two ends of the piezoelectric ceramic plate, respectively; and a middle region of the first piezoelectric element is secured to a side of the support frame, and the side of the support frame is close to the button;
two ends of the second piezoelectric element are secured to the two ends of the piezoelectric ceramic plate, respectively; and a middle region of the second piezoelectric element is secured to a side of the adapter seat and is electrically connected to the adapter seat, and the side of the adapter seat is away from the button; and
the flexible printed circuit is abutted against the piezoelectric ceramic plate and is electrically connected to the piezoelectric ceramic plate.

2. The piezoelectric button assembly according to claim 1, wherein a second limit post is formed by protruding from a side of the adapter seat, and the side of the adapter seat is away from the button; wherein a second limit hole passing through the second piezoelectric element is provided at a position of the second piezoelectric element, and the position of the second piezoelectric element is corresponding to the second limit post; and the second limit post is inserted into the second limit hole.

3. The piezoelectric button assembly according to claim 1, wherein a side of the button is recessed to form a mount recess, and the side of the button is close to the piezoelectric module, wherein the adapter seat is received and secured into the mount recess.

4. The piezoelectric button assembly according to claim 1, wherein the support frame comprises:
a bottom plate;
a first protrusion and a second protrusion protruding from a side of the bottom plate and spaced apart from each other;
wherein the bottom plate, the first protrusion, and the second protrusion enclose to form the receiving space; and
two elastic members are provided, wherein one of the two elastic members is sandwiched and secured between the button and the first protrusion, and the other of the two elastic members is sandwiched and secured between the button and the second protrusion.

5. The piezoelectric button assembly according to claim 4, wherein the support frame further comprises a first limit post formed by protruding from a side of the bottom plate, and the side of the bottom plate is close to the button; wherein a first limit hole passing through the first piezoelectric element is provided at a position of the first piezoelectric element, and the position of the first piezoelectric element is corresponding to the first limit post; and the first limit post is inserted into the first limit hole.

6. The piezoelectric button assembly according to claim 4, wherein each of the two elastic members is made of foam.

7. The piezoelectric button assembly according to claim 4, wherein the flexible printed circuit passes through the bottom plate and is secured to the piezoelectric ceramic plate.

8. The piezoelectric button assembly according to claim 4, further comprising: a waterproof foam sheathed around a peripheral side of the button; wherein the waterproof foam is abutted against the first protrusion and the second protrusion.

9. The piezoelectric button assembly according to claim 8, wherein the peripheral side of the button is recessed to form an accommodation recess, and the waterproof foam is secured into the accommodation recess.

10. An electronic device, comprising:

an enclosure;

a piezoelectric button assembly received in the enclosure, the piezoelectric button assembly comprises:

a support frame having a receiving space therein;

a piezoelectric module received and secured into the receiving space;

a flexible printed circuit passing through the support frame and extending into the receiving space;

a button covered on the support frame and totally covering the receiving space;

an adapter seat secured between the button and the piezoelectric module;

at least one elastic member secured between the button and the support frame;

wherein the piezoelectric module comprises:

a piezoelectric ceramic plate having a shape of a plate;

a first piezoelectric element having an arc shape or a bowl shape;

a second piezoelectric element having an arc shape or a bowl shape;

wherein the first piezoelectric element and the second piezoelectric element are positioned on two opposite sides of the piezoelectric ceramic plate, respectively;

two ends of the first piezoelectric element are secured to two ends of the piezoelectric ceramic plate, respectively; and a middle region of the first piezoelectric element is secured to a side of the support frame, and the side of the support frame is close to the button;

two ends of the second piezoelectric element are secured to the two ends of the piezoelectric ceramic plate, respectively; and a middle region of the second piezoelectric element is secured to a side of the adapter seat and is electrically connected to the adapter seat, and the side of the adapter seat is away from the button; and the flexible printed circuit is abutted against the piezoelectric ceramic plate and is electrically connected to the piezoelectric ceramic plate;

wherein a mount hole is arranged in a side surface of the enclosure, and the support frame is secured onto the enclosure such that the button passes through the mount hole and is exposed outside the enclosure.

11. The electronic device according to claim 10, wherein a side of the button is recessed to form a mount recess, and the side of the button is close to the piezoelectric module, wherein the adapter seat is received and secured into the mount recess.

12. The electronic device according to claim 10, wherein a second limit post is formed by protruding from a side of the adapter seat, and the side of the adapter seat is away from the button; wherein a second limit hole passing through the second piezoelectric element is provided at a position of the second piezoelectric element, and the position of the second piezoelectric element is corresponding to the second limit post; and the second limit post is inserted into the second limit hole.

13. The electronic device according to claim 10, wherein the support frame comprises:

a bottom plate;

a first protrusion and a second protrusion protruding from a side of the bottom plate and spaced apart from each other;

wherein the bottom plate, the first protrusion, and the second protrusion enclose to form the receiving space; and two elastic members are provided, wherein one of the two elastic members is sandwiched and secured between the button and the first protrusion, and the other of the two elastic members is sandwiched and secured between the button and the second protrusion.

14. The electronic device according to claim 13, wherein the support frame further comprises a first limit post formed by protruding from a side of the bottom plate, and the side of the bottom plate is close to the button; wherein a first limit hole passing through the first piezoelectric element is provided at a position of the first piezoelectric element, and the position of the first piezoelectric element is corresponding to the first limit post; and the first limit post is inserted into the first limit hole.

15. The electronic device according to claim 13, wherein each of the two elastic members is made of foam.

16. The electronic device according to claim 13, wherein the flexible printed circuit passes through the bottom plate and is secured to the piezoelectric ceramic plate.

17. The electronic device according to claim 13, further comprising: a waterproof foam sheathed around a peripheral side of the button; wherein the waterproof foam is abutted against the first protrusion and the second protrusion.

18. The electronic device according to claim 17, wherein the peripheral side of the button is recessed to form an accommodation recess, wherein the waterproof foam is secured into the accommodation recess.

* * * * *